(12) United States Patent
Laforge

(10) Patent No.: US 11,547,187 B2
(45) Date of Patent: Jan. 10, 2023

(54) STONE SETTING METHOD

(71) Applicant: The Swatch Group Research and Development Ltd, Marin (CH)

(72) Inventor: Elias Laforge, Neuchatel (CH)

(73) Assignee: The Swatch Group Research and Development Ltd, Marin (CH)

(*) Notice: Subject to any disclaimer, the term of this patent is extended or adjusted under 35 U.S.C. 154(b) by 392 days.

(21) Appl. No.: 16/837,090

(22) Filed: Apr. 1, 2020

(65) Prior Publication Data

US 2021/0030124 A1    Feb. 4, 2021

(30) Foreign Application Priority Data

Jul. 29, 2019    (EP) .................................... 19188836

(51) Int. Cl.
*A44C 17/04*    (2006.01)
*G03F 7/20*    (2006.01)
(Continued)

(52) U.S. Cl.
CPC ............. *A44C 17/04* (2013.01); *A44C 27/00* (2013.01); *B23P 5/00* (2013.01); *G03F 7/20* (2013.01); *C25D 7/005* (2013.01)

(58) Field of Classification Search
CPC .. B23P 5/00; B23P 27/00; A44C 17/04; Y10T 29/23; C25D 7/00; C25D 7/005; G03F 7/20
See application file for complete search history.

(56) References Cited

U.S. PATENT DOCUMENTS 6,125,516 A * 10/2000 Winkler ................. A44C 27/00
63/26
2008/0066310 A1* 3/2008 Pang ...................... A44C 17/04
29/458
(Continued)

FOREIGN PATENT DOCUMENTS

CN         1237093 A    12/1999
CN      109744668 A     5/2019
(Continued)

OTHER PUBLICATIONS

European Search Report dated Dec. 20, 2019 in European Application 19188836.1 file Jul. 29, 2019 (with English Translation of Categories of Cited Documents), citing documents AA and AO therein, 6 pages.
(Continued)

*Primary Examiner* — Matthew P Travers
(74) *Attorney, Agent, or Firm* — Oblon, McClelland, Maier & Neustadt, L.L.P.

(57) ABSTRACT

A method for assembling a stone on a setting support, the stone being cut to exhibit a table, a crown, a girdle and a pavilion, including the steps of: providing a substrate coated with a pattern including an electrically conductive layer covered with a resin layer, the pattern having an inner contour delimiting a hole through the coated substrate and an outer contour corresponding to the outer contour of the desired setting support; removing the resin layer; after dissolution of the resin layer, positioning the stone in the through hole, the stone resting on the electrically conductive layer; and electrodepositing a metal layer on the electrically conductive layer to form the setting support, in order to make the stone integral with the metal layer.

12 Claims, 7 Drawing Sheets

US 11,547,187 B2

Page 2

(51) Int. Cl.
*B23P 5/00* (2006.01)
*A44C 27/00* (2006.01)
*C25D 7/00* (2006.01)

(56) References Cited

U.S. PATENT DOCUMENTS

2018/0079255 A1* 3/2018 Mair .................. B44F 1/066
2019/0133270 A1  5/2019 Bourban et al.

FOREIGN PATENT DOCUMENTS

| EP | 2432632 B1 * | 10/2012 | ............. A44C 17/02 |
| EP | 3024351 B1 * | 10/2016 | ............. A44C 17/04 |
| EP | 3 479 720 A1 | 5/2019 | |
| FR | 2627512 A1 * | 8/1989 | ............. A44C 17/04 |

OTHER PUBLICATIONS

Combined Chinese Office Action and Search Report dated Mar. 15, 2022 in Patent Application No. 202010430004.9 (with English language translation and English translation of Category of Cited Documents), citing documents AO and AP therein, 16 pages.

\* cited by examiner

STONE SETTING METHOD

CROSS-REFERENCE TO RELATED APPLICATION

This application claims priority to European Patent Application No. 19188836.1 filed on Jul. 29, 2019, the entire disclosure of which is hereby incorporated herein by reference.

FIELD OF THE INVENTION

Generally, the invention concerns a method for assembling a stone, particularly a precious or semi-precious stone, on a setting support, the stone being cut to exhibit a table, a crown, a girdle and a pavilion. The invention also concerns a method for setting, on an element of a timepiece or of a piece of jewelry, a stone and its setting support obtained by the assembly method.

BACKGROUND OF THE INVENTION

It is known to set precious, semi-precious or synthetic stones by means of prongs, beads or channels. The conventional setting method of assembling a natural stone, such as a diamond or emerald, in a jewel setting by means of claws generally requires dimensional control of close to $5/100$ mm of the stones. For this reason, this type of setting method is not compatible with that of mass-produced, low-cost set stones using higher precision stones, close to $1/100$ mm, such as synthetic diamond, zircon and ruby.

EP Patent No. 0900533 concerns a hollow jewel including an ornamental stone inserted into a jewel setting and then coated with an electrodeposited material, the stone being secured by said electrodeposited material which surrounds the setting and the stone.

EP Patent No. 2432632 concerns a method for manufacturing an article provided with a precious stone, wherein the precious stone is arranged in or on a retention device and wherein plastic material is injected behind the stone by means of an injection moulding machine. The retention device includes a support sheet on or via which the precious stone is held during the injection moulding process.

EP Patent No. 2421714 concerns a decorative item comprising two substantially parallel plates which are arranged at a distance from one another and at least one of which is partially permeable to visible light. A plurality of precious stones is arranged between the plates. A device intended to fix the precious stones in a specific position is located between the plates. The positioning device includes compartments inside which is arranged a precious stone. At least one of the plates directly adjoins the compartments.

EP Patent No. 3024351 concerns a method for securing a precious stone in a shell made of fusible material, wherein the shell has a hole inside which the precious stone is arranged. The precious stone touches the shell at at least one point. The precious stone is heated by a heat source until the shell changes into an at least partially molten state in the point of contact area, so that a rigid connection can be established between the precious stone and the case after cooling.

Technical Problem

It is an object of the present invention to improve existing solutions for assembling precious or semi-precious stone on a setting support and existing solutions for setting precious stones.

GENERAL DESCRIPTION OF THE INVENTION

A first aspect of the invention concerns a method for assembling a stone on a setting support, the stone being cut to have a table, a crown, a girdle and a pavilion, the method including the steps of:

providing a substrate coated with a pattern comprising an electrically conductive layer covered with a resin layer, the pattern having an inner contour delimiting a hole through the coated substrate and an outer contour corresponding to the outer contour of the desired setting support;

removing the resin layer;

after dissolution of the resin layer, positioning the stone in the through hole, the stone resting on the electrically conductive layer; and electrodepositing a metal layer on the electrically conductive layer to form the setting support, in order to make the stone integral with the metal layer.

Preferably, the stone is positioned such that the pavilion of the stone rests on the electrically conductive layer.

The stone is preferably of natural origin. According to a particular embodiment, the stone is of synthetic origin. The stone may, for example, be a diamond, emerald, zircon or ruby stone.

It will be clear that, in the context of stone setting, such a method advantageously makes it possible to overcome the inevitable dimensional variations typically encountered e.g. when natural stones are used. Indeed, the assembly method described above makes it possible to adapt to the dimensional variations of the stones by providing through holes of different dimensions, adapted to the dimensions of the stones to be assembled.

Preferably, the provision of the coated substrate includes the steps consisting in:

coating the substrate with an electrically conductive layer, preferably by physical vapour deposition (PVD);

depositing a layer of photosensitive resin on the electrically conductive layer; and applying a photolithography process to the resin layer such that the resin remaining after photolithography is delimited by the inner contour and the outer contour of the desired setting support.

The photosensitive resin used may be either a negative photosensitive resin or a positive photosensitive resin.

The electrically conductive layer may, for example, be obtained by deposition of nickel, platinum, silver, chromium, palladium, titanium, gold, titanium nitride, chromium nitride, zirconium nitride, copper or a combination thereof.

The provision of the coated substrate may include the removal, preferably by wet etching, of the electrically conductive layer not covered by the resin layer, so that the remaining electrically conductive layer is delimited by the inner contour and the outer contour of the desired setting support thereby creating the pattern comprising the electrically conductive layer covered with the resin layer. In other words, the resin layer remaining after photolithography acts as a mask, so that the covered area of the electrically conductive layer is not removed.

Optionally, the provision of the coated substrate includes the drilling of the through hole, preferably by laser ablation.

Removal of the resin layer may include chemical dissolution of the resin layer.

According to one embodiment, the method includes the securing, preferably by means of an adhesive, of the stone positioned inside the through hole.

According to a preferred embodiment, the method includes the securing, preferably by an adhesive, of the pavilion of the stone positioned inside the through hole.

Advantageously, the method includes a step of correcting the orientation of the stone positioned in the through hole.

According to one embodiment, the method includes a step of correcting the orientation of the stone positioned in the through hole, followed by a step of securing, preferably by means of an adhesive, the stone positioned in the through hole.

According to a preferred embodiment, the method includes a step of correcting the orientation of the stone positioned in the through hole, followed by a step of securing, preferably by means of an adhesive, the pavilion of the stone positioned in the through hole.

Preferably, the metal layer is deposited so as to encompass the girdle and areas of the crown and of the pavilion contiguous to the girdle in order to make the stone integral with the metal layer. The metal layer thus imprisons the stone to form the setting support.

The electrodeposited metal layer can be made of a material chosen from the group including nickel, gold, silver, platinum, rhodium, palladium, copper and alloys thereof.

The substrate can be made from a material chosen from the group including silicon, ceramic, glass and quartz.

According to a second aspect, the invention concerns a method for setting a stone on an element of a timepiece or piece of jewelry including the mounting of the stone and its setting support, obtained by the assembly method generally described above, on a jewel setting placed on the timepiece or jewelry element or directly on the timepiece or jewelry element.

According to a third aspect, the invention concerns a timepiece or jewelry element comprising at least one stone assembled on its setting support obtained by the assembly method generally described above.

BRIEF DESCRIPTION OF THE DRAWINGS

Other peculiarities and features of the invention will appear from the detailed description of certain advantageous embodiments presented below, by way of illustration, with reference to the annexed drawings in which.

Figure 1:
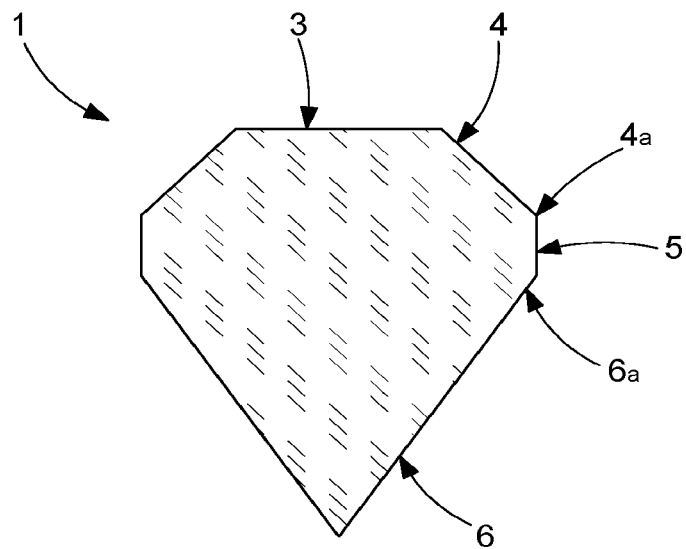
FIG. 1 represents an example of a stone comprising a table, a crown, a girdle and a pavilion.

The reader's attention is drawn to the fact that the drawings are not to scale. Further, for reasons of clarity, the proportions of height, length and/or width, and the dimensions of the empty spaces between the illustrated elements, may not be correctly represented.

DETAILED DESCRIPTION OF SEVERAL EMBODIMENTS OF THE INVENTION

A preferred embodiment of a method for assembling a stone 1 on a setting support 2 according to the invention is described with reference to FIGS. 1 to 12. Stone 1 is cut to exhibit a table 3, a crown 4, a girdle 5 and a pavilion 6 (see FIG. 1). The stone is preferably a stone of natural origin, such as a diamond or emerald, whose dimensions may vary from one stone to another. It is clear that the stone may be of any other natural or synthetic type, particularly precious or semi-precious, as the method can also advantageously be used for such stones.

Figure 3:
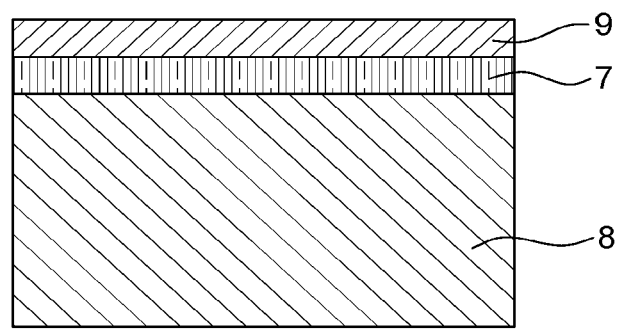

The first step of the assembly method includes a step of depositing an adhesion layer 7 on a substrate 8 by physical vapour deposition with magnetron sputtering, followed, without air exposure, by physical vapour deposition of an electrically conductive layer 9 on adhesion layer 7 (see FIG. 3).

Figure 2:
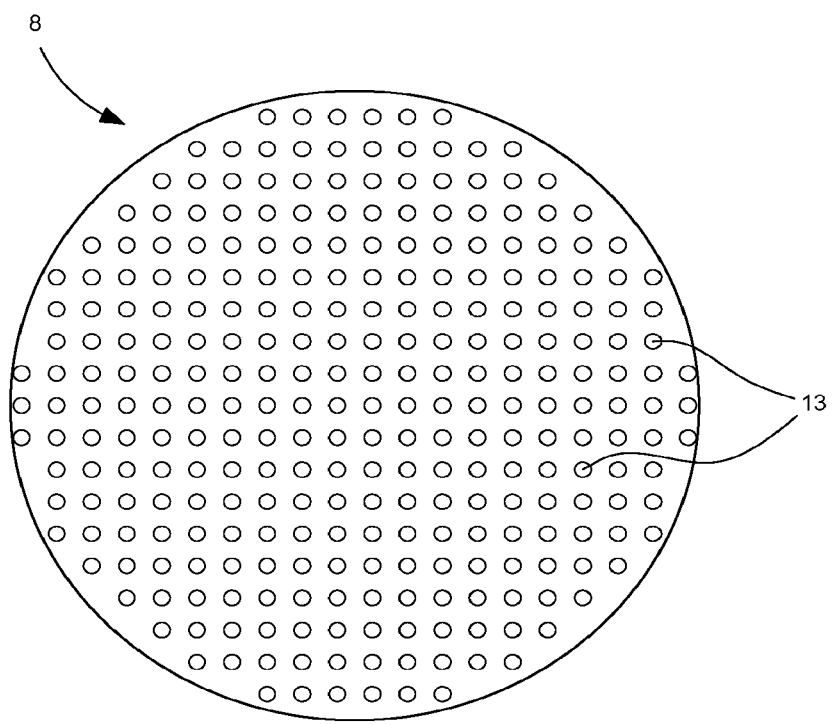
FIGS. 2 to 12 illustrate successive steps of a method for assembling a stone on a setting support according to a preferred embodiment of the invention.

Substrate 8 may be a silicon wafer for micro-electronics (as represented e.g. in FIG. 2). Several stones may be assembled from one substrate 8 (see the plurality of through holes 13 represented in FIG. 2).

Hereafter, the method will be described for the assembly of one stone on a setting support 2, but it is evident that the same method steps can be carried out, possibly concurrently, to assemble several stones on one substrate 8.

The adhesion layer 7 deposited is a titanium layer. Alternatively, or additionally, adhesion layer 7 may contain tantalum, chromium and/or thorium. The thickness of adhesion layer 7 is comprised between 10 nm and 90 nm, preferably between 20 nm and 80 nm, even more preferably between 30 nm and 70 nm, and still more advantageously between 40 nm and 60 nm. A thickness of adhesion layer 7 of (approximately) 50 nm is particularly advantageous.

The deposited electrically conductive layer 9 is a gold layer. It is to be noted that electrically conductive layer 9 can be obtained by deposition of gold, nickel, platinum, silver, chromium, palladium, titanium, titanium nitride, chromium nitride, zirconium nitride, or a combination thereof. The thickness of electrically conductive layer 9 is comprised between 10 nm and 90 nm, preferably between 20 nm and 80 nm, more preferably between 30 nm and 70 nm, even more preferably between 40 nm and 60 nm. A thickness of electrically conductive layer 9 of (approximately) 50 nm is particularly advantageous.

Figure 4:
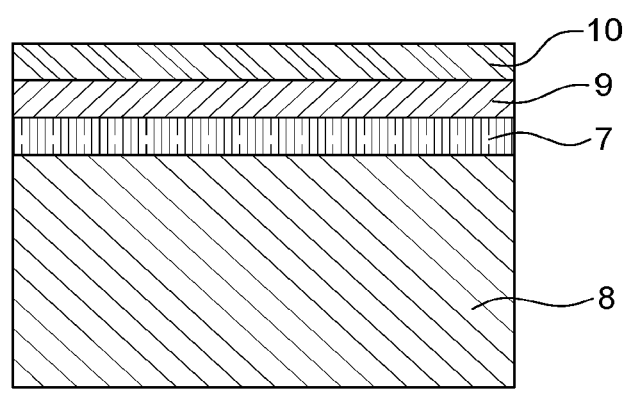
Figure 5:
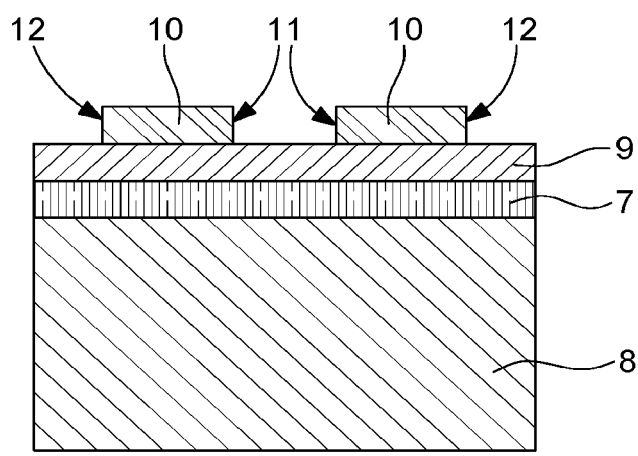

A photosensitive resin layer 10 is then deposited on electrically conductive layer 9 (see FIG. 4). The photosensitive resin may, for example, be AZ 4562 photoresist (MicroChemicals GmbH) or SU-8 photoresist. Part of resin layer 10 is removed by photolithography so that the resin remaining after photolithography delimits inner contour 11 and outer contour 12 of the desired setting support 2. An exposure mask corresponding to inner contour 11 and to outer contour 12 of the desired setting support 2 can advantageously be used in the irradiation step of the photolithography process. In the case of a negative photosensitive resin (e.g. SU-8), the exposure mask protects the part of resin layer 10 which it is wished to remove (the irradiated part becomes insoluble to the developer (solvent)—the non-exposed part of the photosensitive resin layer remains soluble). In the case of a positive photosensitive resin (e.g. AZ 4562), the exposure mask protects the part of resin layer 10 which it is wished to retain (the irradiated part becomes soluble to the developer (solvent)—the non-exposed photosensitive resin part remains insoluble). It will be clear that, during this step, it is very simple to adapt the shape of the resin remaining after photolithography and consequently the shape of the final setting support 2.

Figure 6:
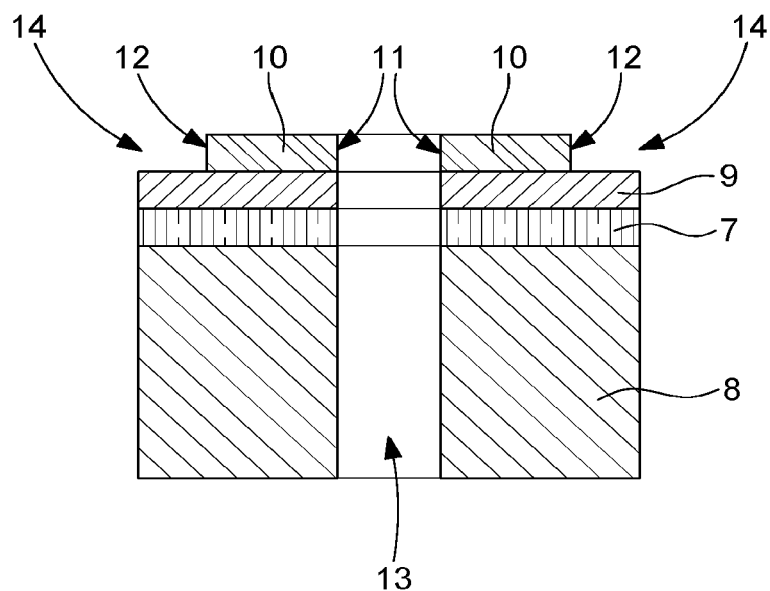

The next step includes drilling a hole 13 through substrate 8, adhesion layer 7, electrically conductive layer 9 and the resin layer 10 remaining after photolithography, by laser ablation (see FIG. 6). The drilling is carried out such that through hole 13 is delimited by the inner contour 11 of the resin layer 10 remaining after photolithography (see FIG. 6). Advantageously, when several stones are to be assembled on one substrate 8, the distribution of through holes 13 over substrate 9 is optimised, in particular as a function of the dimensions delimited by inner contours 11, the shape of the setting supports, etc , to obtain a maximum number of through holes 13 on substrate 8 (see e.g. the distribution represented in FIG. 2).

Figure 7:
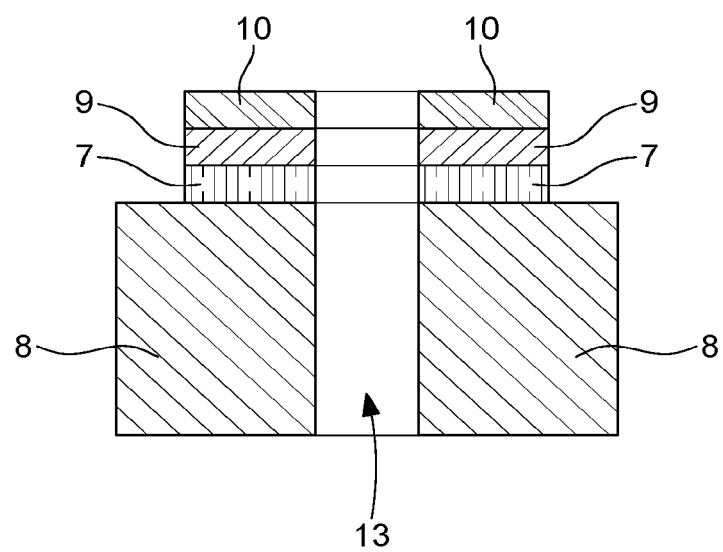
Figure 8:
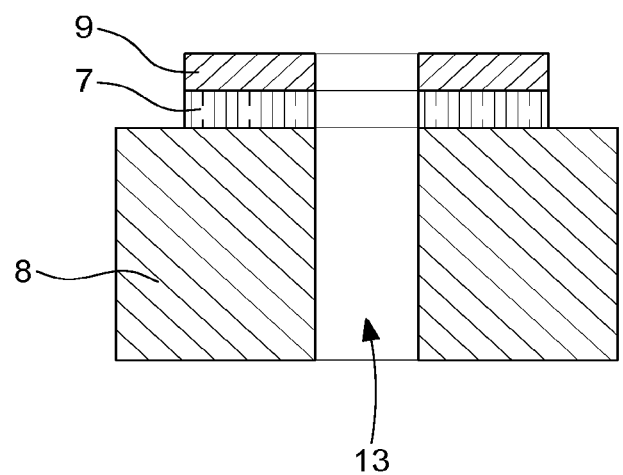

In FIG. 7, the part 14 of electrically conductive layer 9 not covered by resin layer 10 (see FIG. 6) has been removed by wet etching. After etching, the remaining electrically conductive layer 9 is delimited by inner contour 11 and outer contour 12 of the desired setting support 2. The electrically conductive gold layer 9 can be etched, e.g. with aqua regia (nitric acid+hydrochloric acid) or KI (potassium iodide) or KCN (potassium cyanide). The part of adhesion layer 7 not covered by electrically conductive layer 9 (after wet etching of the latter) is also removed by wet etching. After etching, the remaining adhesion layer 7 is also delimited by inner contour 11 and outer contour 12 of the desired setting support 2. The titanium adhesion layer 7 can be etched, e.g. with hydrofluoric acid or buffered oxide etch (BOE). Substrate 8 is now coated with a pattern comprising an electrically conductive layer 9 covered with a resin layer 10, the pattern having an inner contour 11 delimiting through hole 13 and an outer contour 12 corresponding to the outer contour 12 of the desired setting support 2.

Figure 9:
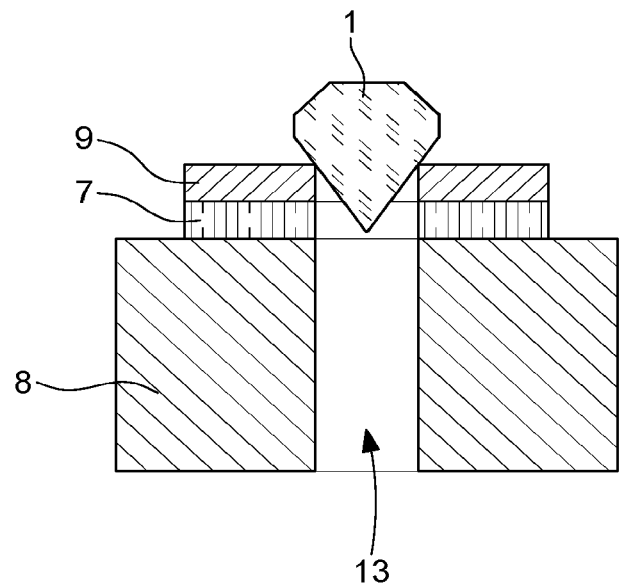
Figure 10:
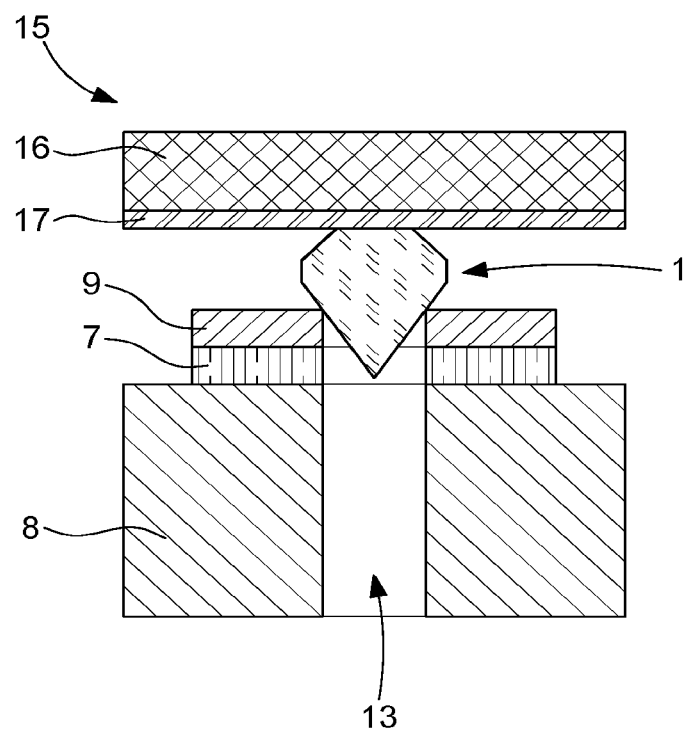
Figure 11:
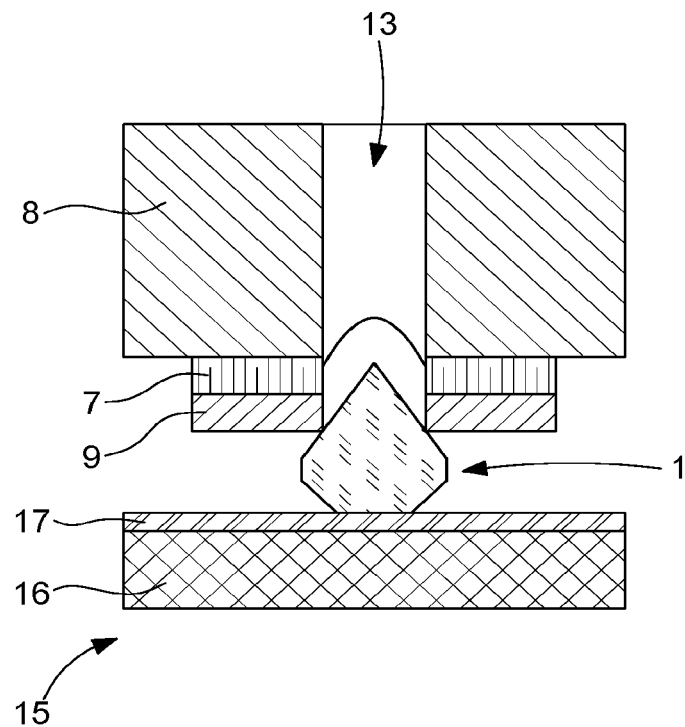
Figure 12:
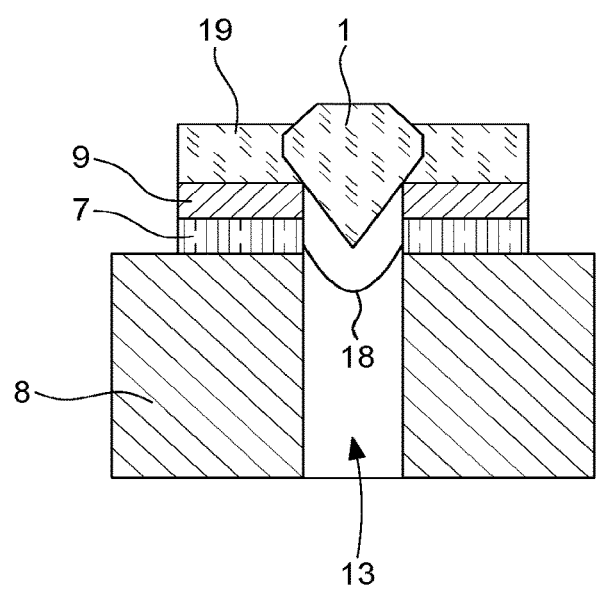

The resin layer 10 remaining after photolithography is then chemically dissolved, e.g. in acetone (see FIG. 8) and stone 1 is positioned in through hole 13 such that the pavilion 6 of stone 1 rests on electrically conductive layer 9 (see FIG. 9).

It is to be noted that the only precise dimensions of the stone able to be ensured are the diameter and the height of girdle 5; it is therefore possible that stone 1 may not be correctly positioned. In particular, sufficient parallelism of the surface of table 3 of stone 1 and the upper surface of substrate 8 may not be ensured during positioning (see e.g. the stone in FIG. 9).

A step of correcting the orientation of stone 1 is implemented to correct any error in the orientation of table 3 of stone 1 with respect to the upper surface of the substrate. Advantageously, and with reference to FIG. 10, this step may include placing table 3 of stone 1 in contact with a repositioning device 15 arranged to reposition stone 1 in through hole 13. Such a repositioning device 15 comprises, for example, a rigid plate 16 coated with a layer of elastically deformable material or with a foam 17 to offset the height of stone 1. Repositioning device 15 is arranged so that the deformable material or foam 17 is placed in contact with table 3 of stone 1 positioned in through hole 13 in order to correct the orientation of stone 1 and to ensure parallelism between table 3 of stone 1 and the upper surface of the substrate. It will be clear that in the case where several stones are to be assembled on one substrate 8, this step can be performed simultaneously for several stones, or even for all the stones e.g. with a repositioning device 15 of similar dimensions to substrate 8.

Prior to removing repositioning device 15, pavilion 6 of stone 1 is secured in through hole 13. This step allows the correct positioning of stone 1 to be maintained inside through hole 13, even after the removal of repositioning device 15. It is, for example, possible to introduce, through the open inlet of through hole 13, a retention adhesive 18 around pavilion 6 of stone 1, allowing stone 1 to be fixed inside through hole 13 (see FIG. 11). To prevent adhesive 18 passing through gaps between stone 1 and electrically conductive layer 9, a sufficiently viscous adhesive 18 can be used that will not fill the narrowest gaps. It is also possible to plug any gaps between stone 1 and conductive layer 9, prior to depositing retention adhesive 18. To this end, it is possible to spray a resin into the gaps, on the opposite side to pavilion 6 of stone 1 (the plugged side of through hole 13—i.e. the side opposite the open inlet side of through hole 13), which resin can easily be removed (by dissolution, for example). It is also possible to provide deposition of an indium layer of around 50 µm on silicon substrate 8 before stone 1 is set in place. The indium layer has the advantage of deforming during the correction of the orientation of stone 1 by leveling table 3 and of then providing a seal.

Repositioning device 15 is then removed.

The next step of the method includes the electrodeposition of a metal layer 19 on electrically conductive layer 9 to form setting support 2. The deposited metal layer is preferably made of a material chosen from the group including nickel, gold, silver, platinum, rhodium, palladium, copper and alloys thereof.

Metal layer 19 is made by electrodeposition from electrically conductive layer 9 around stone 1 to cover at least areas 4a, 6a of crown 4 and where appropriate of pavilion 6, respectively disposed on either side of girdle 5 (see FIG. 1). In other words, metal layer encompasses (covers) girdle 5 and areas 4a, 6a of crown 4 and preferably of pavilion 6, respectively contiguous to girdle 5. Girdle 5 of stone 1 is thus imprisoned within metal layer 19 to form setting support 2, at least substantially around girdle 5 of stone 1. Stone 1 is henceforth integral with setting support 2. It is to be noted that it is preferable for most of crown 4 and pavilion 6 to remain free to expose the maximum surface area of the stone, while still ensuring that the crown and pavilion are covered with an amount of material that allows stone 1 to be securely retained in layer 19.

The conditions for electrodeposition (also called electroforming), particularly the composition of the baths, the system geometry, the voltages and current densities, are selected for each metal or alloy to be electrodeposited according to well-known techniques in the electroforming field (cf., for example, Di Bari G. A. *"Electroforming"* Electroplating Engineering Handbook 4th Edition edited by L. J. Durney, published by Van Nostrand Reinhold Company Inc., N.Y. USA 1984).

The dimensions of setting support 2 are defined by the dimensions, in the plane of substrate 8, of electrically conductive layer 9, and by the height of metal layer 19 deposited according to the electrodeposition parameters.

It is to be noted that, to allow the electrodeposition of metal layer 19, electrically conductive layer 9 must be connected to conduction paths to bring the current. The metal will thus also grow on the conduction paths during the electrodeposition process. One advantage of the present invention is that the stone can easily be released from the conduction paths by applying force to the connection points. This is made possible, amongst other things, by the small space required around deposited metal layer 19. An example configuration of conduction paths 2a is illustrated in FIG. 13a, which configuration allows stones 1 to be easily released.

Stone 1 assembled on its setting support 2 is then released from substrate 8 and from retention adhesive 18. To this end, substrate 8 and retention adhesive 19 are removed by dissolution. For example, potassium hydroxide KOH 20% heated to 85° C. could be used to dissolve silicon substrate 8, and a commercial solvent (e.g. acetone) to dissolve the adhesive.

Figure 13:
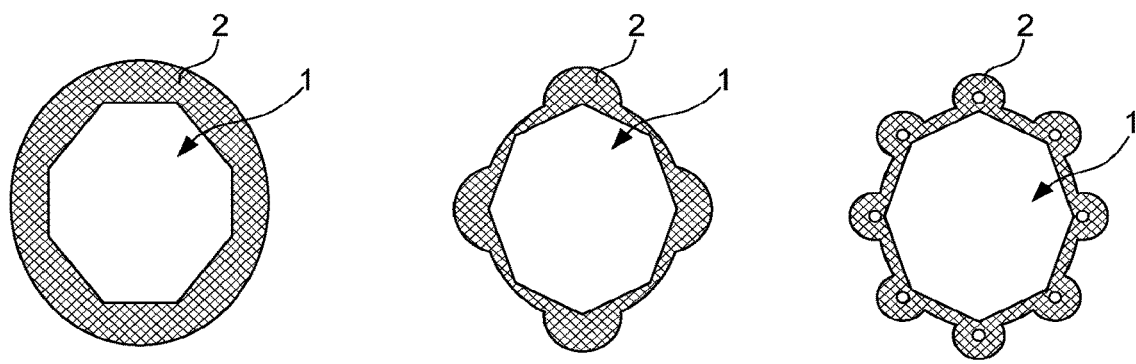
FIGS. 13 and 13a represent top views of different variants of stone shapes and of setting supports obtained according to several embodiments of the method of the invention.
Figure 13A:
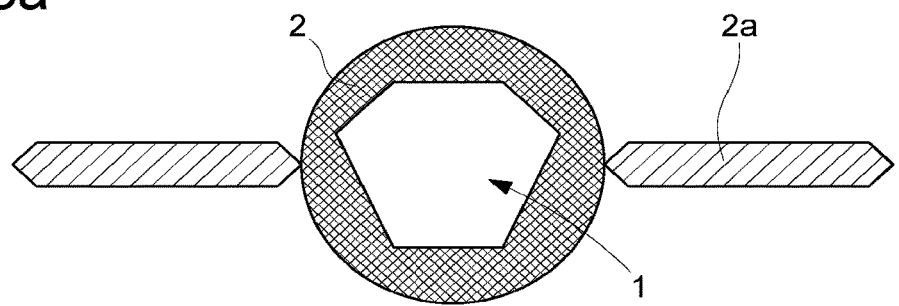

FIG. 13 shows examples of geometries of setting support 2 which can be obtained with an assembly method as described above, e.g. by means of different geometries of photolithography masks.

Figure 14:
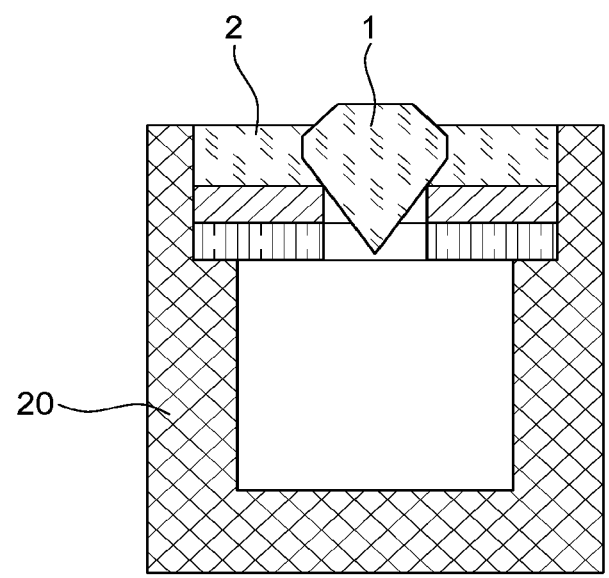
FIG. 14 represents a sectional view representing a stone and its setting support mounted on a jewel setting according to an embodiment of the invention.

The stone 1 assembled on its setting support 2 thus released can be used in the setting method according to the invention. The method for setting a stone on an element of a timepiece of piece of jewelry includes the mounting of stone 1 and its setting support 2, obtained by the assembly method described above, on a jewel setting 20 (as represented e.g. in FIG. 14). Jewel setting 20 is then conventionally placed, for example by press fitting into a suitable recess in the timepiece or jewelry element.

Alternatively, stone 1 and its setting support 2, obtained by the assembly method as described above, are directly mounted on the timepiece or jewelry element.

The mounting of setting support 2 bearing stone 1 on jewel setting 20 or directly on the timepiece or jewelry element can be achieved by means of clips, press-fit, crimping, adhesive bonding, etc.

The timepiece or jewelry element may be, for example, a dial, a bezel, a rotating bezel, a case middle, a horn of the case, a crown, a hand, an index, a link or other bracelet element, an element of a pendant, a ring, a necklace, etc., or any decorative timepiece/jewelry element that can be crimped.

Although particular embodiments have just been described in detail, those skilled in the art will appreciate that various modifications and alternatives thereto can be envisaged in light of the overall teaching provided by the present invention. Consequently, the specific arrangements and/or methods described herein are intended to be given purely by way of illustration, with no intention of limiting the scope of the invention.

The invention claimed is:

1. A method for assembling a stone on a setting support, the stone being cut to exhibit a table, a crown, a girdle and a pavilion, comprising the steps of:
   providing a substrate coated with a pattern comprising an electrically conductive layer covered with a resin layer, the pattern having an inner contour delimiting a hole through the coated substrate and an outer contour corresponding to an outer contour of a desired setting support;
   removing the resin layer;
   after of removing the resin layer, positioning the stone in the hole, the stone resting on the electrically conductive layer; and
   electrodepositing a metal layer on the electrically conductive layer to form the setting support, in order to make the stone integral with the metal layer.

2. The method according to claim I, wherein the provision of the coated substrate comprises the steps of:
   coating the substrate, by physical vapour deposition, with the electrically conductive layer;
   depositing a photosensitive resin layer on the electrically conductive layer; and
   applying a photolithography process to the resin layer such that resin remaining after photolithography is delimited by the inner contour and the outer contour of the desired setting support.

3. The method according to claim 2, wherein providing the coated substrate comprises removing, by wet etching, a portion of the electrically conductive layer not covered by the resin layer, so that a remaining portion of the electrically conductive layer is delimited by the inner contour and the outer contour of the desired setting support thereby creating the pattern comprising the electrically conductive layer covered with the resin layer.

4. The method according to claim 1, wherein providing the coated substrate comprises drilling the hole, by laser ablation.

5. The method according to claim 1, wherein removing the resin layer comprises chemical dissolution of the resin layer.

6. The method according to claim 1, comprising securing, by a retention adhesive, of the stone positioned inside the hole.

7. The method according to claim 1, comprising correcting an orientation of the stone positioned inside the hole.

8. The method according to claim 7, comprising correcting the orientation of the stone positioned inside the hole, followed by securing, by a retention adhesive, of the stone positioned inside the hole.

9. The method according to claim 1, comprising electrodepositing the metal layer to encompass the girdle and areas of the crown and of the pavilion contiguous to the girdle in order to make the stone integral with the metal layer, the metal layer thereby imprisoning the stone to form the setting support.

10. The method according to claim 1, wherein the electrodeposited. metal layer is made of a material chosen from the group consisting of nickel, gold, silver, platinum, rhodium, palladium, copper and alloys thereof.

11. The method according to claim 1, wherein the substrate is made from a material chosen from the group consisting of silicon, ceramic, glass and quartz.

12. A method for setting a stone on an element of a timepiece or piece of jewellery comprising mounting the stone on the setting support by the method according to claim 1 and mounting the stone and the setting support on a jewel setting placed on the timepiece or jewellery element or directly on the timepiece or jewellery element.

* * * * *